(12) United States Patent
Maruthamuthu et al.

(10) Patent No.: US 10,867,934 B2
(45) Date of Patent: Dec. 15, 2020

(54) COMPONENT MAGNETIC SHIELDING FOR MICROELECTRONIC DEVICES

(71) Applicant: Intel IP Corporation, Santa Clara, CA (US)

(72) Inventors: Saravana Maruthamuthu, Munich (DE); Thomas Ort, Veitsbronn (DE); Andreas Wolter, Regensburg (DE); Andreas Augustin, Munich (DE); Veronica Sciriha, Munich (DE); Bernd Waidhas, Pettendorf (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/937,542

(22) Filed: Mar. 27, 2018

(65) Prior Publication Data

US 2019/0304922 A1    Oct. 3, 2019

(51) Int. Cl.
| | |
|---|---|
| *H01L 23/552* | (2006.01) |
| *H01L 23/498* | (2006.01) |
| *H01L 21/48* | (2006.01) |
| *H01L 23/00* | (2006.01) |
| *H01L 23/31* | (2006.01) |
| *H01L 23/64* | (2006.01) |
| *H01F 41/00* | (2006.01) |
| *H01F 27/28* | (2006.01) |

(52) U.S. Cl.
CPC .......... *H01L 23/552* (2013.01); *H01L 21/486* (2013.01); *H01L 21/4857* (2013.01); *H01L 23/3128* (2013.01); *H01L 23/49827* (2013.01); *H01L 23/49838* (2013.01); *H01L 23/645* (2013.01); *H01L 24/16* (2013.01); *H01L 24/81* (2013.01); *H01F 27/2804* (2013.01); *H01F 41/00* (2013.01); *H01L 2224/16227* (2013.01); *H01L 2224/16235* (2013.01); *H01L 2224/16265* (2013.01); *H01L 2924/19042* (2013.01); *H01L 2924/19102* (2013.01); *H01L 2924/3025* (2013.01)

(58) Field of Classification Search
CPC ... H01L 23/552; H01L 21/4857; H01L 24/16; H01L 24/81; H01L 23/49827; H01L 21/486; H01L 23/645; H01L 23/49838; H01L 23/3128; H01L 2224/16235; H01L 2224/16265; H01L 2924/3025; H01L 2924/19042; H01L 2924/19102; H01L 2224/16227; H01F 41/00; H01F 27/2804
See application file for complete search history.

(56) References Cited

U.S. PATENT DOCUMENTS

| | | | | |
|---|---|---|---|---|
| 7,141,883 | B2 * | 11/2006 | Wei | H01L 23/552 |
| | | | | 257/778 |
| 2013/0223041 | A1 * | 8/2013 | Arnold | H01L 23/552 |
| | | | | 361/818 |
| 2018/0316319 | A1 * | 11/2018 | Kim | H01L 23/49816 |

FOREIGN PATENT DOCUMENTS

DE    102019104914 A1    10/2019

* cited by examiner

*Primary Examiner* — David Vu
(74) *Attorney, Agent, or Firm* — Schwegman Lundberg & Woessner, P.A.

(57) ABSTRACT

A microelectronic device may include a substrate, a component, a first plate, a second plate, and a shield. The component may be disposed at least partially within the substrate. The first plate may be disposed on a first side of the component. The second plate may be disposed on a second side of the component. The shield may be disposed around at least a portion of a periphery of the component.

12 Claims, 10 Drawing Sheets

US 10,867,934 B2

COMPONENT MAGNETIC SHIELDING FOR MICROELECTRONIC DEVICES

TECHNICAL FIELD

Embodiments described herein generally relate to semiconductor devices.

BACKGROUND

Microelectronic devices may use various electrical components in circuits to perform tasks. Some electrical components may emit magnetic and/or electromagnetic fields and other electrical components may be sensitive to magnetic and/or electromagnetic fields. In some cases, the components may be shielded to prevent unwanted magnetic and/or electromagnetic interference between components.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Some integrated circuit packages may use electrical components susceptible to magnetic and/or electromagnetic interference, such as inductors. In some applications, a nearby electromagnetic and/or magnetic field may cause interference to the signal of the component. For example, two adjacent inductors may cause both electromagnetic interference and magnetic interference. This problem has been addressed in some prior art by increasing physical separation of potentially interfering components, which may increase manufacturing costs and may increase power consumption.

For example, multiple in multiple out (MIMO) and some receiver diversity specifications require an Isolation of about −100 decibels (dB) between inductors in radio frequency (RF) sub-systems of transceiver integrated circuits (ICs) to prevent cross talk between the inductors. The current IC technology making use of spacing and package placement may limit isolation to around about 60-70 dB leading to an increase in chip area and an increase in power dissipation.

This disclosure discusses, in one example, microelectronic devices, such as packages, that may include components that are susceptible to interference caused by magnetic and/or electromagnetic fields when the component is located fully or partially within a substrate. This disclosure proposes, in some examples, to reduce interference of the components by providing shielding at least partially embedded within the substrate and at least partially surrounding the component. In some examples, the component may be shielded by a pair of plates disposed above and below the component, and by a shield disposed between the plates that surrounds (or partially surrounds) the component. In some examples, the shield may be comprised of a plurality of vias spaced to limit transmission of electromagnetic and magnetic signals therethrough while minimally impacting the quality factor (Q) of the circuit and/or the inductance of the inductor.

Figure 1B:
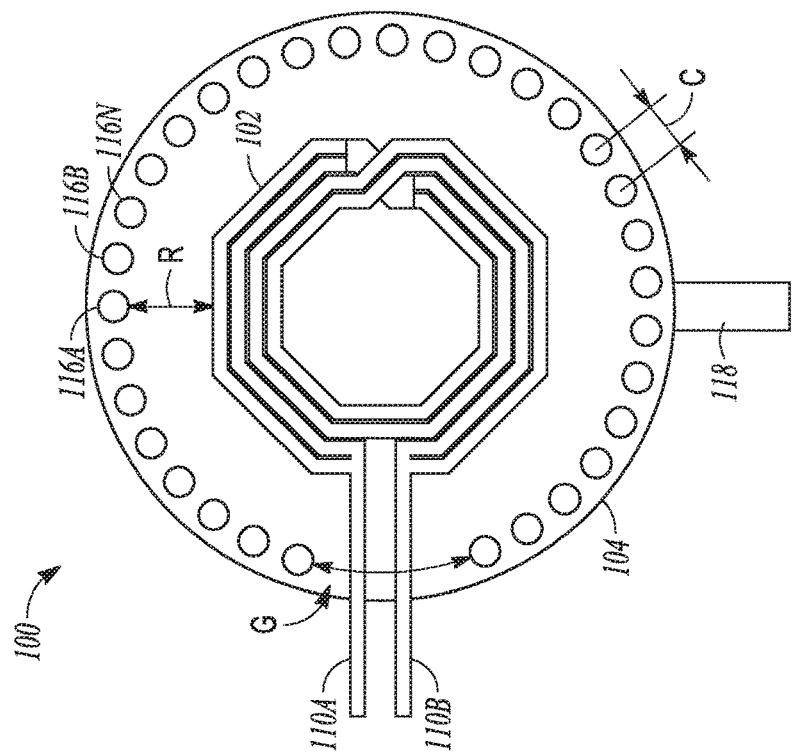
FIG. 1B illustrates a planar view of a portion of a package, in accordance with at least one example of the present disclosure.
Figure 1A:
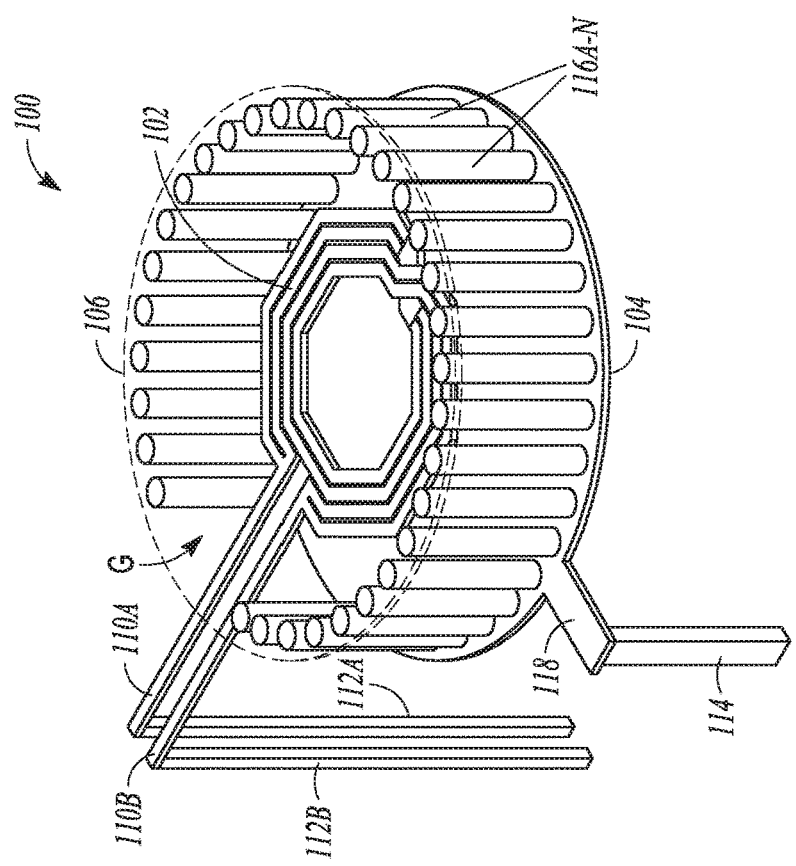
FIG. 1A illustrates an isometric view of a portion of a package, in accordance with at least one example of the present disclosure.

FIG. 1A illustrates an isometric view of a portion of package 100, in accordance with at least one example of the present disclosure. FIG. 1B illustrates a planar view of a portion of package 100 from a bottom perspective, in accordance with at least one example of the present disclosure. FIGS. 1A and 1B are discussed concurrently below.

Package 100 may include inductor 102, top plate 104, bottom plate 106, shield 108, inductor connectors 110A and 110B, inductor vias 112A and 112B (only shown in FIG. 1A), and ground via 114 (only shown in FIG. 1A). Shield 108 may include shield vias 116A-N. Top plate 104 may include grounding tab 118. Also show in FIG. 1A are orientation indicators Top and Bottom. Also shown in FIG. 1B are gap G, radial distance R, and circumferential distance C.

Package 100 may generally be a microelectronic package of a microelectronic device, such as an integrated circuit board, including transistors and circuits of any of multiple forms known in the industry, providing conductive structures, physical support for components, and electrical contacts to distribute signals. Package 100 may include one or more dies, which may each be physically supported by package 100 and electrically connected to package 100.

Inductor 102 may be a passive electrical component configured to store electrical energy by passing current therethrough. Inductor 102 may be any type of inductor, such as an RF inductor or a ferromagnetic inductor. Inductor 102 may be coupled to a die (discussed below) through inductor vias 112A and 112B and inductor connectors 110A and 110B. Inductor 102 may include crossovers, which may be conductive elements configured to connect sets of turns of inductor 102. In some examples, inductor 102 may be a two turn octagonal substantially planar inductor. In other examples, inductor 102 may have other geometric shapes and may include more or less turns, as discussed further below. Inductor connectors 110A and 110B and vias 112A and 112B may be electrically conductive elements configured to transmit electrical signals and may be comprised of conductive materials such as copper, silver, aluminum, gold, and the like.

Top plate 104 and bottom plate 106 may be metallic plates configured to limit transmission of magnetic and electromagnetic signals therethrough and may be comprised of materials such as nickel, copper, gold, alloys thereof, and the like. Top plate 104 and bottom plate 106 may have a disk shape in some examples. That is, top plate 104 and bottom plate 106 may be of a geometric shape of a cylinder having a relatively low height to radius ratio. In some examples, top plate 104 may include grounding tab 118 extending radially from top plate 104 and configured to connect to grounding via 114. In other examples, a grounding tab may be on bottom plate 106 and in yet other examples, a ground tab may be on both top plate 104 and bottom plate 106.

In some configurations, top plate 104 and bottom plate 106 may be on opposing sides of inductor 102. That is top plate 104 may be on a first side of inductor 102 and bottom plate 106 may be on a second side of inductor 102. Top plate 104 and bottom plate 106 may be spaced away from inductor 102 to avoid contact and therefore grounding of inductor 102, as discussed below in FIG. 2.

Shield 108 may be an array of shield vias 116A-116N in some examples, extending between top plate 104 and bottom plate 106 and connecting to both the top plate 104 and bottom plate 106 to ground the entire assembly of top plate 104, bottom plate 106, and shield 108 (including all of shield vias 116A-116N). There may be 1, 2, 3, 4, 5, 10, 15, 20, 30, 40 and the like of vias 116A-116N.

Vias 116A-116N may substantially surround a periphery of inductor 102 and two of vias 116A-116N may be separated by a gap G that may be sized to allow inductor connectors 110A and 110B to extend through vias 116A-116N without contacting vias 112A-112N, top plate 104, or bottom plate 106. In other examples, there may be no gap G in vias 116A-116N and top plate 104 or bottom plate 106 may include a hole or opening sized to allow inductor connectors 110A and 110B to extend therethrough. In other examples, shield 108 may have other shapes and may be manufactured using other processes, as discussed further below.

In some examples, vias 116A-116N may be radially spaced away from inductor 102 by radial distance R and each of vias 116A-116N may be spaced from each other by circumferential distance C. In some examples, radial distance R and circumferential distance C (together with a quantity of vias 116A-116N, in some examples) may be adjusted to provide a desired amount of shielding for inductor 102 and to provide a desired quality factor (Q) for a circuit of inductor 102 and/or the inductance of inductor 102. The shielding and Q can be balanced, as desired.

In operation of some examples, inductor 102 may send and receive signals to and from a die or another component of package 100. Because inductors are sensitive to electromagnetic and magnetic fields, inductor 102 may receive electromagnetic and magnetic signals from nearby components that may interfere with operation of inductor 102 and the components with which inductor 102 is connected. For example, inductors may be used in pairs (one for a receiver and one for a transmitter). In these examples, the inductors may be simultaneously active and therefore transmitting electromagnetic and magnetic signals that may cause crosstalk and general interference. The construction of package 100 addresses this problem by allowing shield 108, together with top plate 104 and bottom plate 106, to act as a shield for inductor 102 of electromagnetic signals and magnetic signals. By reducing interference of signals to and from inductor, required amplification, and therefore power consumption, 102 may be reduced, saving time and cost.

Further, because inductor 102 is substantially shielded, inductor 102 may be placed in close proximity to a source of electromagnetic and/or magnetic signals, which may reduce a size of package 100, further saving cost. This shielding may also allow inductor 102 to be placed within a substrate instead of on top of a chip, which may further reduce a chip area.

Figure 2:
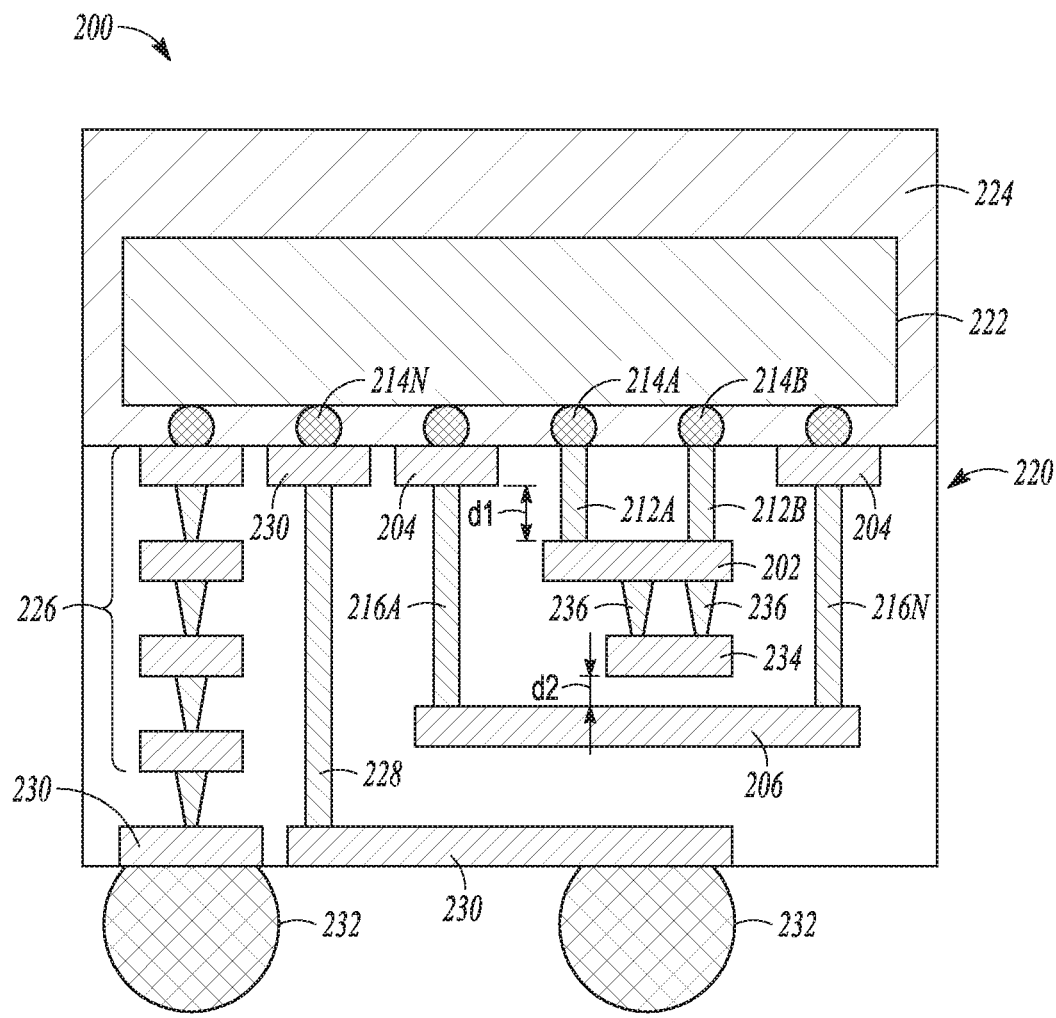
FIG. 2 illustrates an elevation view of a cross-section of a portion of a package, in accordance with at least one example of the present disclosure.

FIG. 2 illustrates an elevation view of a cross-section of a portion of package 100, in accordance with at least one example of the present disclosure. Package 200 may include inductor 202, top plate 204, bottom plate 206, shield 208, inductor vias 212A and 212B, micro balls 214A-214N, substrate 220, die 222, encapsulation 224, vertical contacts 226 and 228, contacts 230, solder balls 232, crossovers 234, and crossover vias 236. Shield 208 may include shield vias 216A-116N. Top plate 204 may include grounding tab 218. FIG. 2 also shows distances d1 and d2. Also shown in FIG. 2 are orientation indicators Top and Bottom. Though the examples below (and above) may be described with reference to orientation indications Top and Bottom, the examples are not so limited as being oriented relative to any bodies having typically similar references, such as the earth or ground.

Package 200 of FIG. 2 may be consistent with package 100 of FIGS. 1A and 1B discussed above, however, package 200 shows micro balls 214A-214N, substrate 220, die 222, encapsulation layer 224, vertical contacts 226 and 228, contacts 230, solder balls 232, crossovers 234, and crossover vias 236.

Substrate 220 may be a dielectric body comprised of one or more dielectric materials and configured to support various microelectronic components of package 200 without transmitting electric signals between components, vias, and contacts disposed within and connected to substrate 220.

Die 222 may be a die comprising logic gates and conductors to form, in some examples, a memory module or processor. As shown in FIG. 2, die 222 may be electrically connected to components of substrate 220 via micro-bumps 214A-214N, which may be comprised of conductive materials such as gold, silver, platinum, copper, and the like. Die 222 may be secured relative to substrate 220 by encapsulation 224.

Encapsulation 224 may be a polymer encapsulation layer, such as an epoxy resin or polyimide. Encapsulation 224 may surround and enclose die 222, a top portion of substrate 220, micro-bumps 214A-214B, and components extending from substrate 220 (such as top plate 204). By encapsulating the components of package 100, encapsulation 224 may electrically insulate and may protect the components of package 100.

Vertical contacts 226 and 228 and contacts 230 may be conductive elements disposed in substrate 220 and may be comprised of conductive materials such as gold, silver, platinum, copper, and the like. Vertical contacts 226 and 228 may be configured to distribute power or communication signals to die 222. Solder balls 232 may be conductive elements configured to secure package 200 to one or more other electrical components, such as another package or board.

Crossovers 234 may be conductive elements configured to connect sets of turns of inductor 202 and may be electrically coupled to inductor 234 through crossover vias 236. Ball grid array 206 may be an array, such as a grid, of solder balls or other conductive balls attached to a bottom portion of substrate 202 and configured to connect to conductors, traces, wires, and the like.

Package 200 may operate consistently with package 100 of FIGS. 1A and 1B. However, package 200 shows how inductor 202 may connect to die 222 using inductor vias 212A and 212B through micro-bumps 214A and 214B, respectively. In this example configuration, inductor vias 212A and 212B may extend through an opening in top plate 204.

Package 200 also shows distances d1 and d2, where distance d1 is that distance between inductor 202 and top plate 204 and distance d2 is the distance between bottom plate 206 and inductor 202. In some examples, distances d1 and/or d2 may be adjusted through adjusting relative placements of top plate 204, bottom plate 206, and/or inductor 204 to adjust a quality factor (Q) of a circuit containing inductor 202. In some examples, distances d1 and d2 may be selected for balance of Q with volume consumed by top plate 204, bottom plate 206, and inductor 202.

Figure 3B:
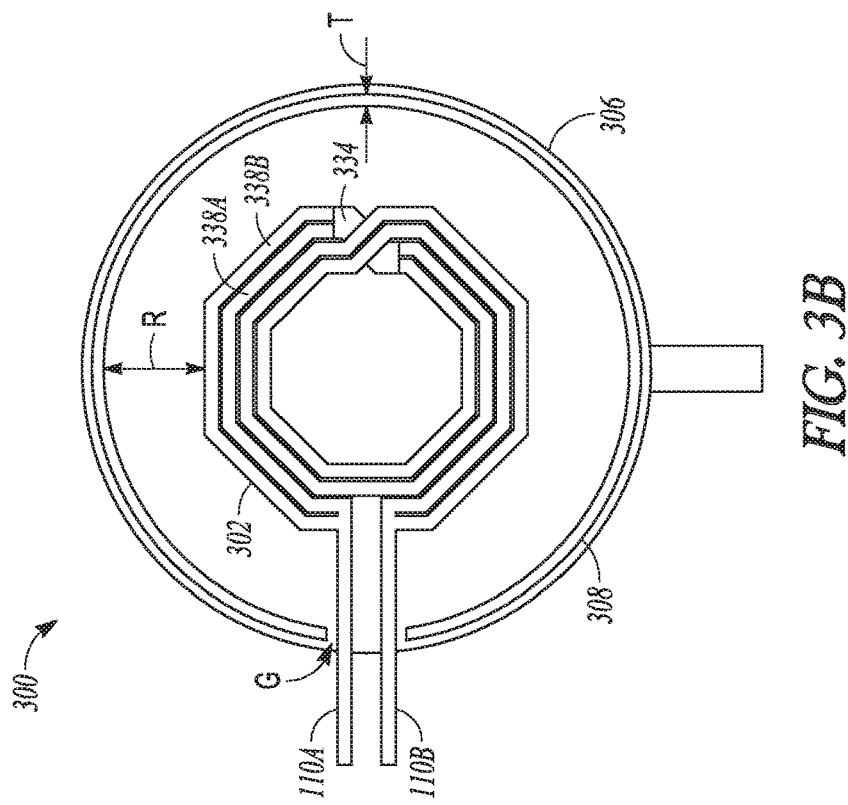
FIG. 3B illustrates a plan view of a portion of a package, in accordance with at least one example of the present disclosure.
Figure 3A:
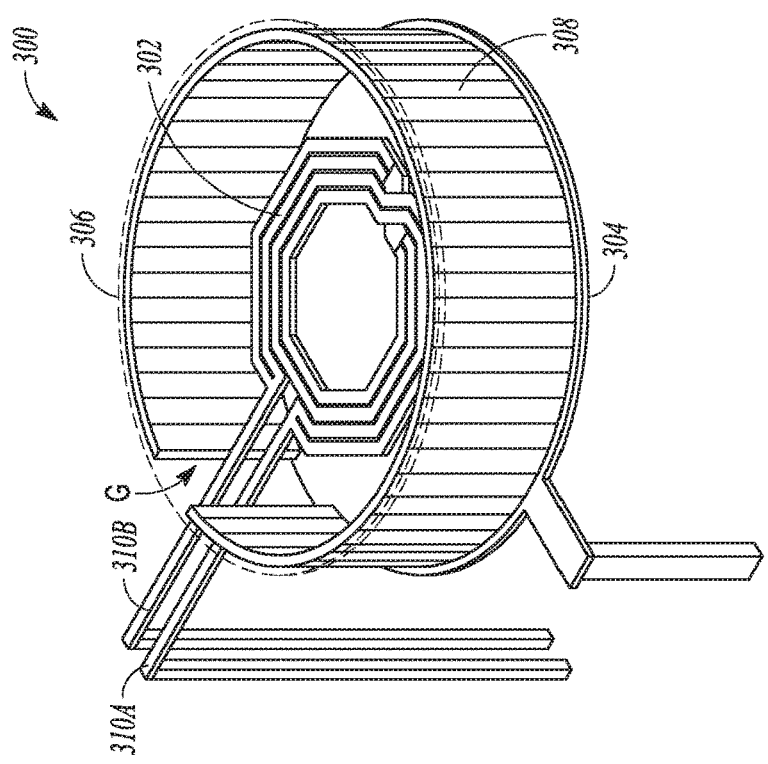
FIG. 3A illustrates an isometric view of a portion of a package, in accordance with at least one example of the present disclosure.

FIG. 3A illustrates an isometric view of a portion of package 300, in accordance with at least one example of the present disclosure. FIG. 3B illustrates a top plan view of a portion of package 300, in accordance with at least one example of the present disclosure. FIGS. 3A and 3B are discussed concurrently below.

Package 300 may include inductor 302, top plate 304, bottom plate 306, shield 308, inductor connectors 310A and 310B, inductor crossovers 334, and inductor turns 338A and 338B. Also shown in FIGS. 3A and 3B is gap G. Also shown in FIG. 3B is radial distance R and thickness T.

Package 300 may be similar to packages 100 and 200, except that shield 308 of package 300 may be a substantially continuous shield (or wrap) disposed between top plate 304 and bottom plate 306 where two ends of shield 308 may stop short of completely surrounding inductor 302 to leave gap G between the ends, allowing inductor connectors 310A and 310B to extend through gap G. In some examples, a trench may be machined into a substrate and shield 308 may be created by filling the trench with a material configured to limit transmission of magnetic and electromagnetic signals therethrough such as nickel, copper, gold, alloys thereof, and the like.

Shield 308 may be spaced from inductor 302 by radial distance R, which may vary due to the shape of inductor 302 and/or the geometric shape of shield 308. In some examples, shield 308 may have a geometric shape of an incomplete hollow cylinder with an open top and bottom, where the top and bottom are in contact with and enclosed by top plate 304 and bottom plate 306 to form a grounded assembly. In other examples, shield 308 may have other geometric shapes, as discussed below in FIGS. 4A and 4B.

Shield 308 may have a radial thickness T that may be consistent throughout a height of shield 308 or may vary, as desired. In some examples, thickness T and radial spacing R may be varied to select for a quality factor (Q) of a circuit including inductor 302. Though shield 308 is shown as a continuous member in FIGS. 3A and 3B, shield 308 may be comprised of multiple sections to improve manufacturing cost and efficiencies, in some examples.

Figure 4B:
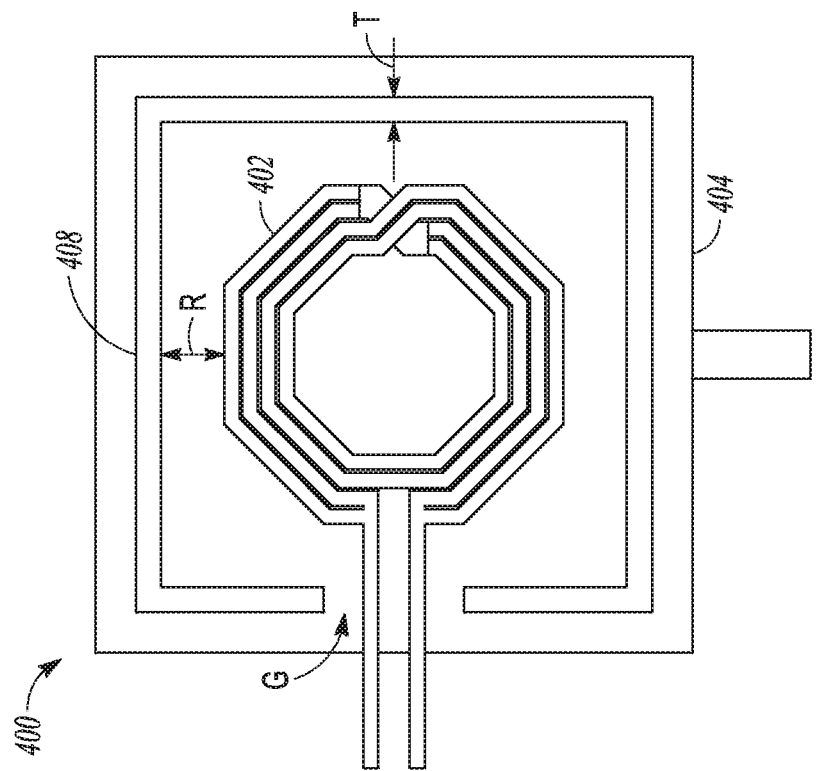
FIG. 4B illustrates a plan view of a portion of a package, in accordance with at least one example of the present disclosure.
Figure 4A:
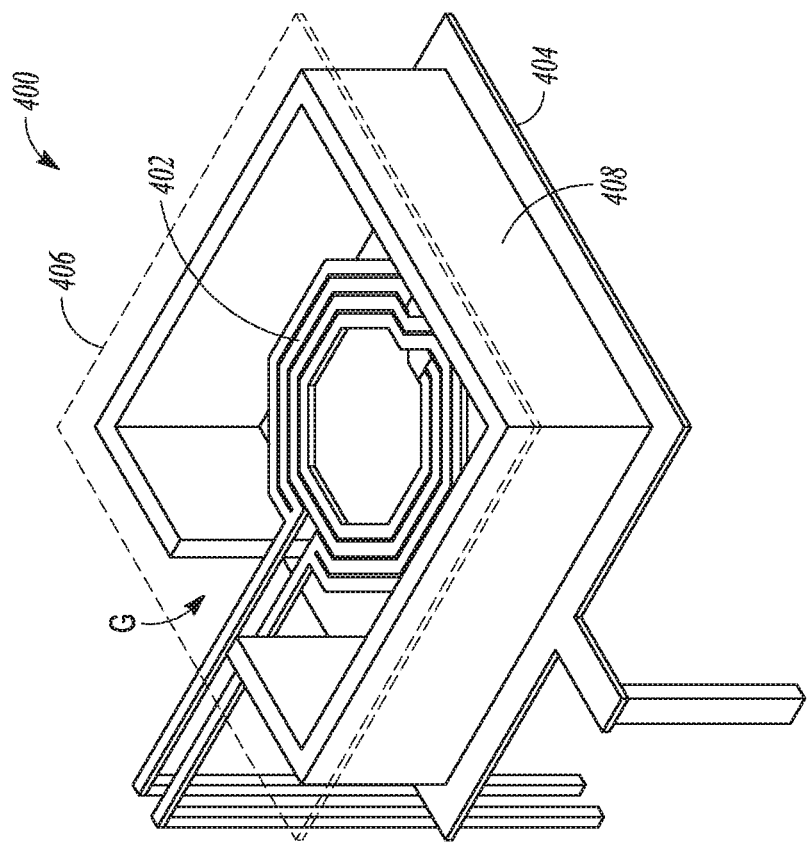
FIG. 4A illustrates an isometric view of a portion of a package, in accordance with at least one example of the present disclosure.

FIG. 4A illustrates an isometric view of a portion of package 400, in accordance with at least one example of the present disclosure. FIG. 4B illustrates a plan view of a portion of package 400, in accordance with at least one example of the present disclosure. FIGS. 4A and 4B are discussed below concurrently.

Package 400 may include inductor 402, top plate 404, bottom plate 406, shield 408, and inductor connectors 410A and 410B. Also shown in FIGS. 4A and 4B is gap G. Also shown in FIG. 4B is radial distance R and thickness T.

Package 400 may be similar to package 300 discussed above, except that shield 408 of package 400 may have a geometric shape of an incomplete hollow cuboid with an open top and bottom that may be enclosed respectively by top plate 404 and bottom plate 406. Accordingly, top plate 404 and bottom plate 406 may have geometric shapes of substantially rectangular prisms sized to enclose shield 408; however, top plate 404 and bottom plate 406 can have other shapes in other examples. As shown in FIG. 4B, the walls of shield 408 may be contiguous and may substantially surround inductor 402 aside from gap G.

Similar to package 300 discussed above, shield 408 may be modified to adjust one or both of radial distance R and thickness T of package 400 to modify a quality factor of a circuit including inductor 404 as desired. In examples, where the walls of shield 408 are non-contiguous, the walls may also be moved relative to each other and to inductor 402 to adjust Q.

Figure 5:
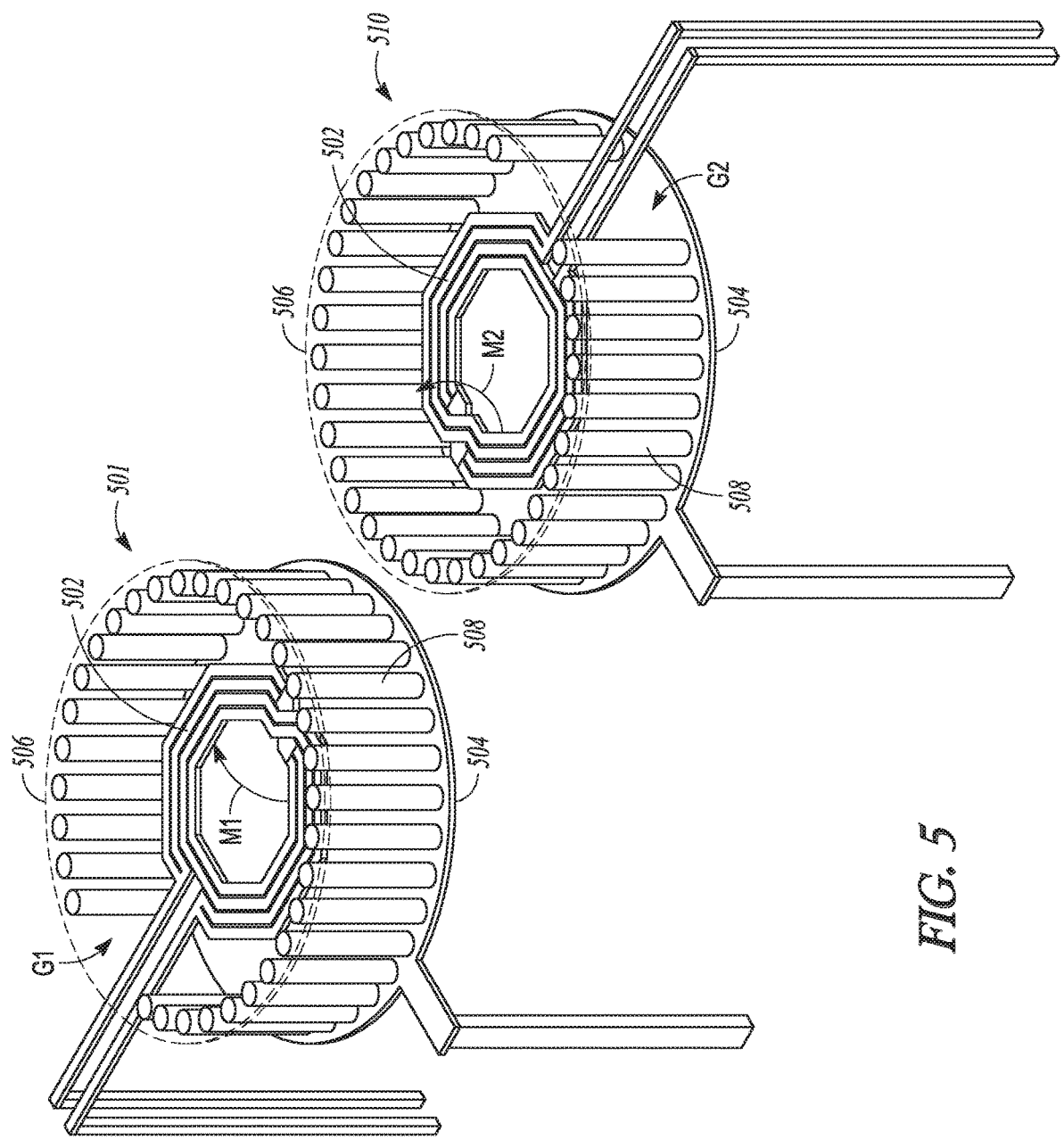
FIG. 5 illustrates an isometric view of a portion of a package, in accordance with at least one example of the present disclosure.

FIG. 5 illustrates an isometric view of a portion of package 500, in accordance with at least one example of the present disclosure. Package 500 may include shielded assembly 501 and shielded assembly 510. Shielded assembly 501 may include inductor 502, top plate 504, bottom plate 506, and gap G1. Shielded assembly 510 may include inductor 512, top plate 514, and bottom plate 516. Also shown in FIG. 5 are fields M1 and M2 and gap G2.

Package 500 may be similar to package 100 discussed above, except that package 500 may include two shielded assemblies. In some examples, components shielded assembly 501 and shielded assembly 510 may be on shared plane or layer, which may provide manufacturing efficiency. However, in the prior art, when two inductors are embedded in a substrate in relatively close proximity, cross-talk and interference may occur. Package 500 addresses this problem by shielding inductor 502 with top plate 504, bottom plate 506, and shield 508 as well as by shielding inductor 512 with top plate 514, bottom plate 516, and shield 518. In some examples, only one of inductors 502 and 512 may be shielded. In other examples, a single shield may be disposed between inductors 502 and 512.

FIG. 5 further illustrates how connectors of each inductor may extend through the shield while still limiting interference. In one example, shown in FIG. 5, gap G1 of shielded assembly 501 may face away from shielded assembly 510. Similarly, gap G2 of shielded assembly 510 may face away from shielded assembly 501. This may help to limit interference caused by placing inductor 502 in close proximity to inductor 512. For example, field M1 (which may be a magnetic field or an electromagnetic field), may be limited from being transmitted beyond shield 508 of shielded assembly 501 and field M2 (which may be a magnetic field or an electromagnetic field), may be limited from being transmitted beyond shield 508 of shielded assembly 510. Similarly, shield 508 of shielded assembly 501 may shield inductor 502 of shielded assembly 501 from field M2 and shield 508 of shielded assembly 510 may shield inductor 502 of shielded assembly 510 from field M1.

Figure 6:
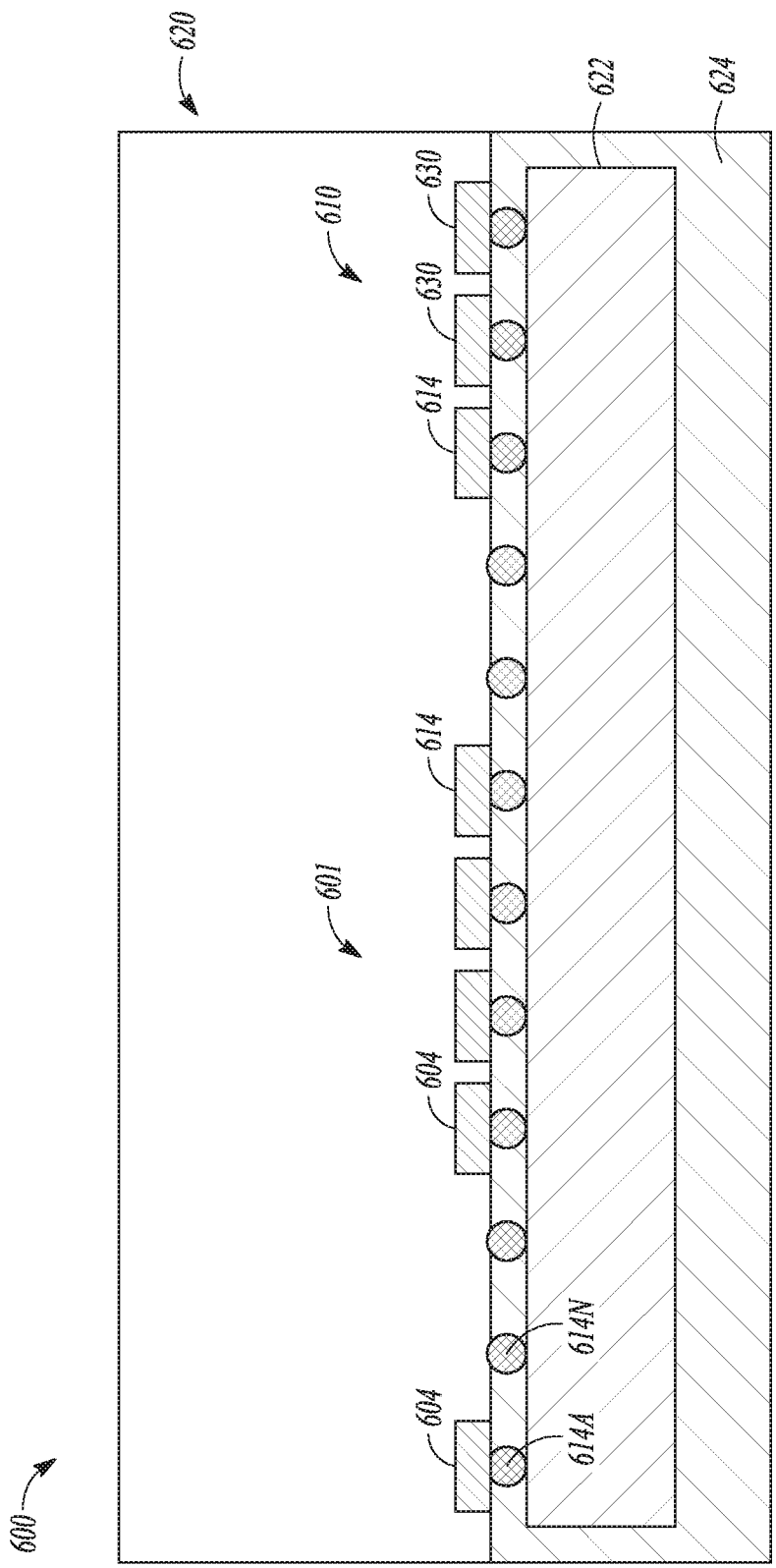
FIG. 6 illustrates an elevation view of a cross section of a portion of a package, in accordance with at least one example of the present disclosure.

FIG. 6 illustrates an elevation view of a cross section of a portion of package 600, in accordance with at least one example of the present disclosure. Package 600 may include shielded assembly 601 and shielded assembly 610. Shielded assembly 601 may include inductor 602 and top plate 604. Shielded assembly 610 may include inductor 612 and top plate 614. Package 600 may also include micro-bumps 614A-614N, die 622, encapsulation 624, and contacts 630.

Package 600 may be consistent with packages 100-500 discussed above. However, FIG. 6 illustrates how package 600 may be manufactured, in some examples. For example, micro-bumps 614 may be coupled to die 622 using encapsulation 624. Each of micro-bumps 614A-614N may then be electrically connected to a component (while disposed in a substrate or before being disposed in a substrate). For example, op plates 604 and 614 may be electrically connected to and coupled to micro-bumps 614. Contacts 630 may also be connected to micro-bumps 614. Though top plates 604 and 614 are shown as being two pieces (or having an opening), each of top plates 604 and 614 may be a single, substantially continuous plate coupled to multiple of micro-bumps 614.

Figure 7:
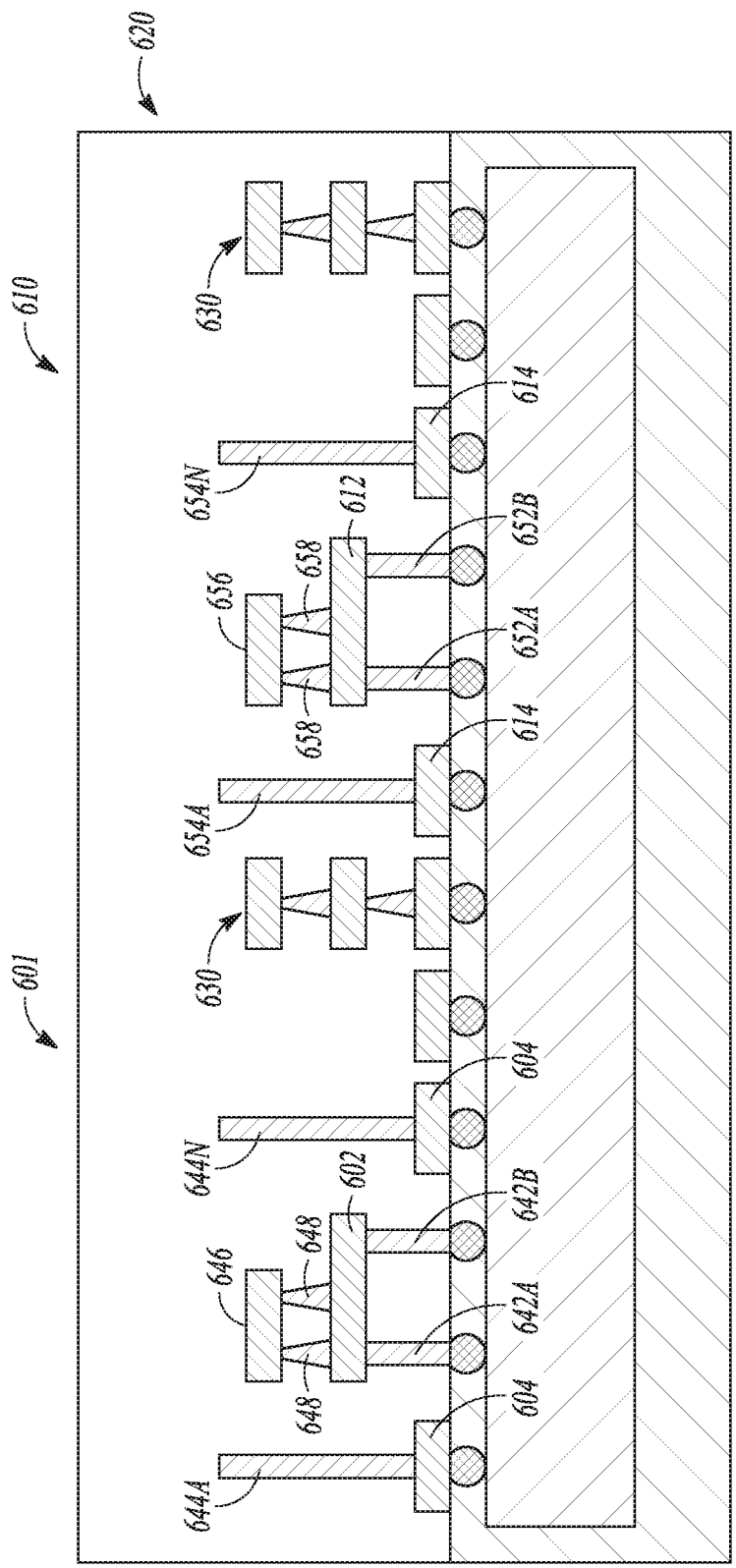
FIG. 7 illustrates an elevation view of a cross section of a portion of a package, in accordance with at least one example of the present disclosure.

FIG. 7 illustrates an elevation view of a cross section of a portion of package 600, in accordance with at least one example of the present disclosure. Package 600 may include shielded assembly 601 and shielded assembly 610. Shielded assembly 601 may include component 602, top plate 604, component vias 642A and 642B, shield vias 644A and 644B, crossover 646, and crossover vias 648. Shielded assembly 610 may include component 612, top plate 614, component vias 652A and 652B, shield vias 654A and 654B, crossovers 656, and crossover vias 658. Package 600 may also include micro-bumps 614A-614N, die 622, encapsulation 624, and contacts 630.

FIG. 7 illustrates how additional components of package 600 may be built up. For example, component vias 652A and 652B may be connected to component 612 and micro-bumps 614 for coupling to die 622. Component 602 may be similarly connected, where component vias 642A and 642B pass through top plate 604 to connect to micro-bumps 614. FIG. 7 also shows how contactors 630 may be built up and how shield vias 642A-642N and 652A-652N may be built up from top plates 604 and 614, respectively. In some examples, shield vias 642A-642N and 652A-652N may be created using laser-drilling and filling processes. In some other examples, package 600 may be manufactured using a process of plating of a molded compound substrate to achieve generally cylindrical vias as opposed to vias of conical shapes (typically achieved through laser drilling). This may allow shield vias 642A-642N and shield vias 652A-652N to be generally continuous and substantially cylindrical to allow for high density vias.

Use of plated vias may also allow for use of vias of various shapes. In this way, each shielded assembly may be entirely formed from plating. For example, a plated via may surround component 602 (without contacting component 602) to provide a shield, eliminating the need for top plates 604 and 614, which may save bill of material (BOM) cost, in some cases.

FIG. 7 also shows that various components may be used as component 602 and 612, as many passive microelectronic components may be disposed partially or fully within a substrate. For example, components 602 and 612 may be inductors, transformers, magnetic couplers, power combiners, and power dividers.

Figure 8:
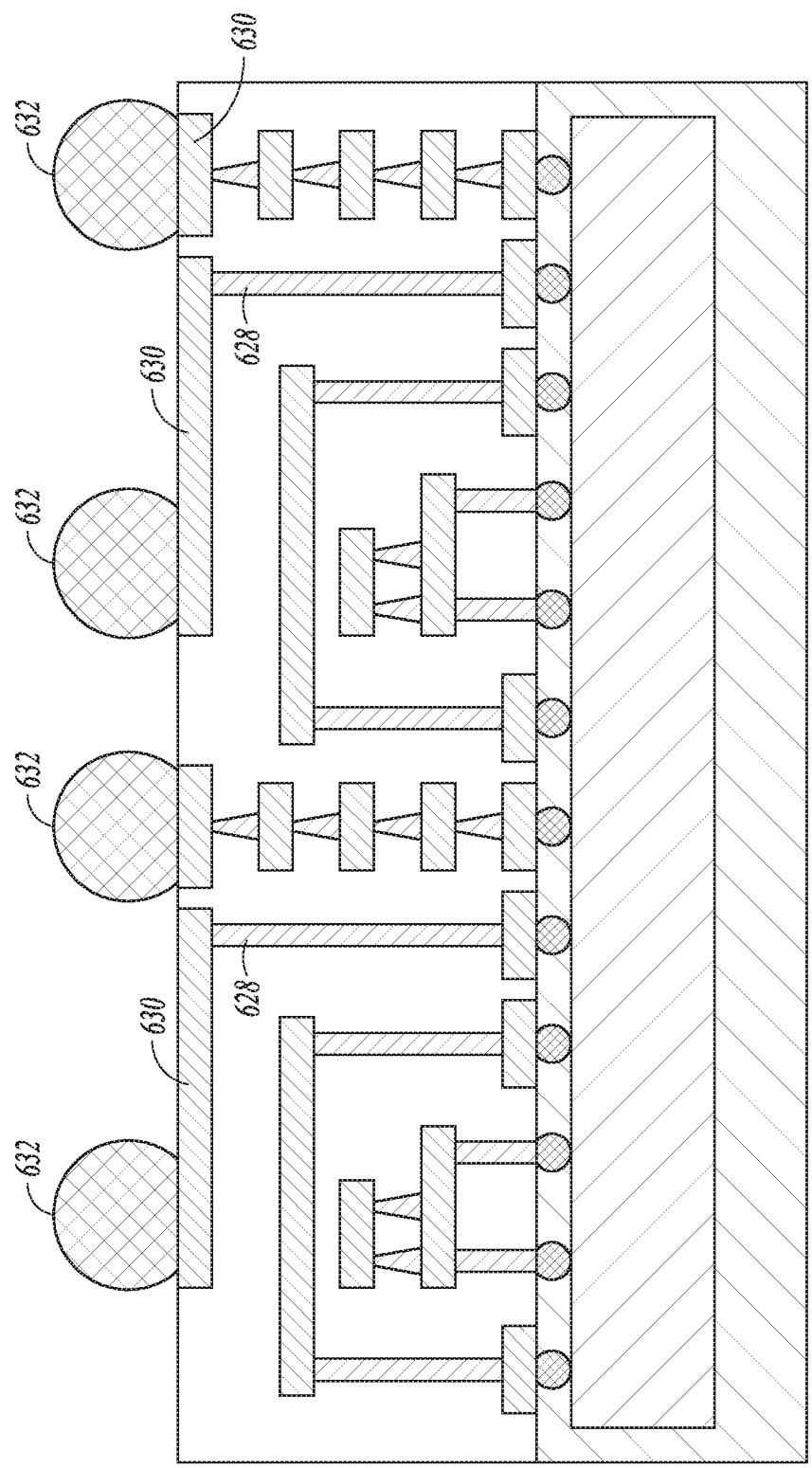
FIG. 8 illustrates an elevation view of a cross section of a portion of a package, in accordance with at least one example of the present disclosure.

FIG. 8 illustrates an elevation view of a cross section of a portion of package 600, in accordance with at least one example of the present disclosure. With respect to FIG. 8, package 600 further includes bottom plates 604 and 614, vertical contactors 628, and solder balls 632.

Figure 9:
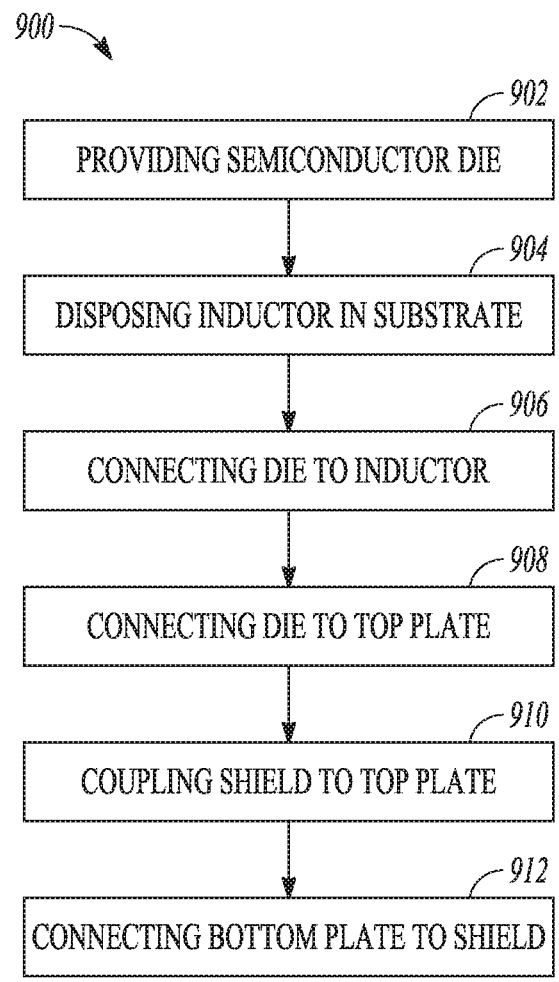
FIG. 9 illustrates a schematic view of a method of manufacturing a portion of a package, in accordance with at least one example of the present disclosure.

FIG. 9 illustrates a schematic view of an example method 900 of manufacturing a portion of a package, in accordance with at least one example of the present disclosure. The operations of method 900 are illustrated in a particular order for convenience and clarity. Many of the discussed operations may be performed in a different sequence or in parallel without materially impacting other operations. Method 900, as discussed, includes operations performed by multiple different actors, devices, and/or systems. It is understood that subsets of the operations discussed in method 900 attributable to a single actor, device, or system could be considered a separate standalone process or method. Method 900 includes examples of processes that can be used to manufacture some or all of the components of the devices discussed above with respect to FIGS. 1-8.

In some examples, method 900 may be a method of forming a microelectronic device beginning at operation 902, which may include providing a semiconductor die including a plurality of circuits, such as die 222 of FIG. 2. At operation 904, an inductor may be disposed in a substrate. For example, inductor 202 may be disposed in substrate 220, as shown in FIG. 2. At operation 906, the die may be electrically connected to the inductor. For example, die 222 may be electrically connected to inductor 202, as shown in FIG. 2.

At operation 908, the die may be electrically connected to a top plate of a shield that is disposed on a first side the inductor. For example, die 222 may be electrically connected to top plate 204 that is disposed on a first side of inductor 202. At operation 910, a shield may be coupled to the top plate, such that the shield substantially surrounds a periphery of the component. For example, shield 208 may be coupled to top plate 204. At operation 912 a bottom plate may be coupled to the shield, where the bottom plate disposed on a second side of the inductor, and where the shield, the top plate, and the bottom plate to together limit transmission of electromagnetic signals to and from the inductor. For example, bottom plate 206 may be coupled to shield 208, where bottom plate 206 is disposed on a second side of inductor 202, and where shield 208, top plate 204, and bottom plate 206 together limit transmission of electromagnetic signals to and from inductor 202, in operation.

In another example, method 900 may include an operation where one or more of the top plate and the bottom plate are electrically connected to a ground connection. In some other examples, method 900 may include an operation where the shield may be coupled to the top plate by connecting a plurality of vias to the top plate to substantially surround the periphery of the inductor.

In some examples, method 900 may include an operation of laser drilling the substrate to create via bores around at least a portion of the periphery of the component and may include an operation of filling the via bores to form a plurality of vias. In some other examples, method 900 may include an operation of laser drilling the substrate to create a trench around at least a portion of the periphery of the component and filling the trench to form a substantially continuous shield.

Figure 10:
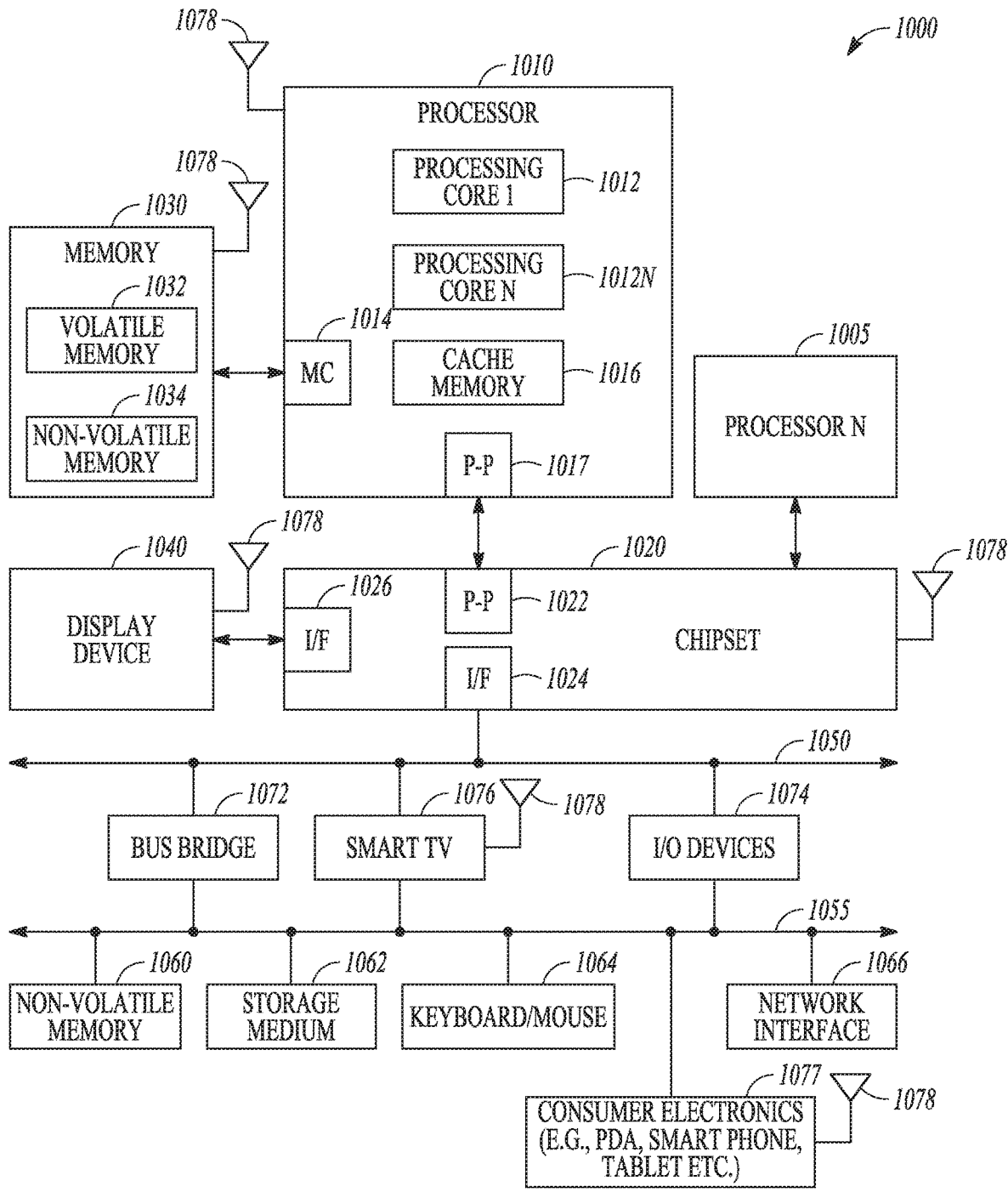
FIG. 10 illustrates a system level diagram, in accordance with at least one example of the present disclosure.

FIG. 10 illustrates a system level diagram, depicting an example of an electronic device (e.g., system) including the packages and shielded assemblies described in the present disclosure. FIG. 10 is included to show an example of a higher level device application for the packages. In one embodiment, system 1000 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type, of computing/electronic device. In some embodiments, system 1000 is a system on a chip (SOC) system.

In one embodiment, processor 1010 has one or more processor cores 1012 and 1012N, where 1012N represents the Nth processor core inside processor 1010 where N is a positive integer. In one embodiment, system 1000 includes multiple processors including 1010 and 1005, where processor 1005 has logic similar or identical to the logic of processor 1010. In some embodiments, processing core 1012 includes, but is not limited to, pre-fetch logic to fetch instructions, decode logic to decode the instructions, execution logic to execute instructions and the like. In some embodiments, processor 1010 has a cache memory 1016 to cache instructions and/or data for system 1000. Cache memory 1016 may be organized into a hierarchal structure including one or more levels of cache memory.

In some embodiments, processor 1010 includes a memory controller 1014, which is operable to perform functions that enable the processor 1010 to access and communicate with memory 1030 that includes a volatile memory 1032 and/or a non-volatile memory 1034. In some embodiments, processor 1010 is coupled with memory 1030 and chipset 1020. Processor 1010 may also be coupled to a wireless antenna 1078 to communicate with any device configured to transmit and/or receive wireless signals. In one embodiment, an interface for wireless antenna 1078 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 1032 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 1034 includes, but is not limited to, flash memory, phase change memory (PCM), read-only memory (ROM), electrically erasable programmable read-only memory (EEPROM), or any other type of non-volatile memory device.

Memory 1030 stores information and instructions to be executed by processor 1010. In one embodiment, memory 1030 may also store temporary variables or other intermediate information while processor 1010 is executing instructions. In the illustrated embodiment, chipset 1020 connects with processor 1010 via Point-to-Point (PtP or P-P) interfaces 1017 and 1022. Chipset 1020 enables processor 1010 to connect to other elements in system 1000. In some embodiments of the example system, interfaces 1017 and 1022 operate in accordance with a PtP communication protocol such as the Intel® QuickPath Interconnect (QPI) or the like. In other embodiments, a different interconnect may be used.

In some embodiments, chipset 1020 is operable to communicate with processor 1010, 1005N, display device 1040, and other devices, including a bus bridge 1072, a smart TV 1076, I/O devices 1074, nonvolatile memory 1060, a storage medium (such as one or more mass storage devices) 1062, a keyboard/mouse 1064, a network interface 1066, and various forms of consumer electronics 1077 (such as a PDA, smart phone, tablet etc.), etc. In one embodiment, chipset 1020 couples with these devices through an interface 1024. Chipset 1020 may also be coupled to a wireless antenna 1078 to communicate with any device configured to transmit and/or receive wireless signals.

Chipset 1020 connects to display device 1040 via interface 1026. Display 1040 may be, for example, a liquid crystal display (LCD), a plasma display, cathode ray tube (CRT) display, or any other form of visual display device. In some embodiments of the example system, processor 1010 and chipset 1020 are merged into a single SOC. In addition, chipset 1020 connects to one or more buses 1050 and 1055 that interconnect various system elements, such as I/O devices 1074, nonvolatile memory 1060, storage medium 1062, a keyboard/mouse 1064, and network interface 1066. Buses 1050 and 1055 may be interconnected together via a bus bridge 1072.

In one embodiment, mass storage device 1062 includes, but is not limited to, a solid state drive, a hard disk drive, a universal serial bus flash memory drive, or any other form of computer data storage medium. In one embodiment, network interface 1066 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 10 are depicted as separate blocks within the system 1000, the functions performed by some of these blocks may be integrated within a single semiconductor circuit or may be implemented using two or more separate integrated circuits. For example, although cache memory 1016 is depicted as a separate block within processor 1010, cache memory 1016 (or selected aspects of 1016) may be incorporated into processor core 1012.

Further Notes and Examples

To better illustrate the methods and apparatuses described herein, a non-limiting set of example embodiments are set forth below as numerically identified examples:

Example 1 is a microelectronic device comprising: a substrate; a die coupled to the substrate; a component disposed at least partially within the substrate and connected to the die; a first plate disposed on a first side of the component and spaced away from the component; a second plate disposed on a second side of the component and spaced away from the component; a shield disposed around at least a portion of a periphery of the component and, together with the first plate and the second plate, to limit transmission of electromagnetic signals to and from the component.

In Example 2, the subject matter of Example 1 optionally includes wherein the shield connects to the first plate and the second plate.

In Example 3, the subject matter of any one or more of Examples 1-2 optionally include a conductive element connected to the component; wherein the shield includes an opening, the conductive element extending through the opening.

In Example 4, the subject matter of any one or more of Examples 1-3 optionally include the shield further comprising: a plurality of vias disposed in the substrate around the component, the plurality of vias substantially surrounding the component and spaced to limit transmission of electromagnetic signals to and from the component.

In Example 5, the subject matter of any one or more of Examples 1-4 optionally include, wherein the plurality of vias are spaced from each other and from the component to achieve a desired quality factor of the component.

In Example 6, the subject matter of any one or more of Examples 1-5 optionally include the shield further comprising: a substantially continuous shield disposed in the substrate around the component, the substantially continuous shield substantially surrounding the component to limit transmission of electromagnetic signals to and from the component.

In Example 7, the subject matter of any one or more of Examples 5-6 optionally include wherein the shield, together with the first plate and second plate, substantially forms a geometric shape of one of a hollow cuboid and a hollow cylinder.

In Example 8, the subject matter of any one or more of Examples 1-7 optionally include a grounding via coupled to one of the first plate and the second plate and to ground.

In Example 9, the subject matter of any one or more of Examples 1-8 optionally include wherein the component comprises a portion of a circuit including a phase-locked loop circuit, a low-power transmitter, a low-power receiver, a local area network antenna circuit, and a power amplifier.

In Example 10, the subject matter of any one or more of Examples 1-9 optionally include wherein the component comprises one of an inductor, a transformer, a magnetic coupler, a power combiner, and a power divider.

Example 11 is a microelectronic device comprising: substrate; a die coupled to the substrate; a first shielded assembly and a second shielded assembly spaced away from the first shielded assembly, each of the first shielded assembly and the second shielded assembly disposed in the substrate, and first shielded assembly and the second shielded assembly each comprising: a component located at least partially within the substrate, the component electrically connected to the die; a first plate disposed on a first side of the component and spaced away from the component; a second plate disposed on a second side of the component and spaced away from the component; a shield disposed around a periphery of the component and, together with the first plate and the second plate, to limit transmission of electromagnetic signals to and from the component.

In Example 12, the subject matter of Example 11 optionally includes each of the first shielded assembly and the second shielded assembly further comprising: a conductive element electrically connected to the component and to the die.

In Example 13, the subject matter of any one or more of Examples 11-12 optionally include the shield of each of the first shielded assembly and the second shielded assembly further comprising: an opening in the shield, the conductive element passing therethrough.

In Example 14, the subject matter of any one or more of Examples 11-13 optionally include wherein the opening of the shield of the first shielded assembly faces away from the opening of the shield of the second shielded assembly.

In Example 15, the subject matter of any one or more of Examples 11-14 optionally include wherein the shield connects to the first plate and the second plate.

In Example 16, the subject matter of any one or more of Examples 11-15 optionally include the shield further comprising: a plurality of vias disposed in the substrate around the component, the plurality of vias substantially surrounding the component and spaced to limit transmission of electromagnetic signals to and from the component.

In Example 17, the subject matter of Example 16 optionally includes wherein the plurality of vias are spaced from each other and from the component to achieve a desired quality factor of the component.

In Example 18, the subject matter of any one or more of Examples 11-17 optionally include the shield further comprising: a substantially continuous shield disposed in the substrate around the component, the wrap substantially surrounding the component to limit transmission of electromagnetic signals to and from the component.

Example 19 is a method of forming a microelectronic device, the method comprising: providing a semiconductor die including a plurality of circuits; disposing an inductor in a substrate; connecting, electrically, the die to the inductor; connecting, electrically, the die to a top plate of a shield that is disposed on a first side the inductor; coupling a shield to the top plate, such that the shield substantially surrounds a periphery of the component; coupling a bottom plate to the shield, the bottom plate disposed on a second side of the inductor, wherein the shield, the top plate, and the bottom plate to together limit transmission of electromagnetic signals to and from the inductor.

In Example 20, the subject matter of Example 19 optionally includes connecting, electrically, one or more of the top plate and the bottom plate to a ground connection.

In Example 21, the subject matter of any one or more of Examples 19-20 optionally include wherein coupling the shield to the top plate includes connecting a plurality of vias to the top plate to substantially surround the periphery of the inductor.

In Example 22, the subject matter of any one or more of Examples 19-21 optionally include laser drilling the substrate to create via bores around at least a portion of the periphery of the component; and filling the via bores to form a plurality of vias.

In Example 23, the subject matter of any one or more of Examples 19-22 optionally include laser drilling the substrate to create a trench around at least a portion of the periphery of the component; and filling the trench to form a substantially continuous shield.

In Example 24, the subject matter of any of the devices, systems, and methods of claims 1-23 can optionally be combined with any element or subject matter of any of the devices, systems, and methods of any other claim.

The above detailed description includes references to the accompanying drawings, which form a part of the detailed description. The drawings show, by way of illustration, specific embodiments in which the disclosure may be practiced. These embodiments are also referred to herein as "examples." Such examples may include elements in addition to those shown or described. However, the present disclosure also contemplates examples in which only those elements shown or described are provided. Moreover, the present disclosure also contemplates examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The invention claimed is:

1. A microelectronic device comprising:
   a substrate;
   a die coupled to the substrate;
   a first shielded assembly and a second shielded assembly spaced away from the first shielded assembly, each of the first shielded assembly and the second shielded assembly disposed in the substrate, and first shielded assembly and the second shielded assembly each comprising:
      a component located at least partially within the substrate, the component electrically connected to the die;
      a first plate disposed on a first side of the component and spaced away from the component;
      a second plate disposed on a second side of the component and spaced away from the component, wherein the component is located between the die and the first plate, or between the die and the second plate; and
      a shield disposed around a periphery of the component and, together with the first plate and the second plate, to limit transmission of electromagnetic signals to and from the component; and
      wherein the shield of the first shielded assembly is located between the component of the first shielded assembly and the component of the second shielded assembly.

2. The microelectronic device of claim 1, each of the first shielded assembly and the second shielded assembly further comprising:
   a conductive element electrically connected to the component and to the die.

3. The microelectronic device of claim 1, the shield of each of the first shielded assembly and the second shielded assembly further comprising:
   an opening in the shield, the conductive element passing therethrough.

4. The microelectronic device of claim 3, wherein the opening of the shield of the first shielded assembly faces away from the opening of the shield of the second shielded assembly.

5. The microelectronic device of claim 1, wherein the shield connects to the first plate and the second plate.

6. The microelectronic device of claim 1, the shield further comprising:
   a plurality of vias disposed in the substrate around the component, the plurality of vias substantially surrounding the component and spaced to limit transmission of electromagnetic signals to and from the component.

7. The microelectronic device of claim 6, wherein the plurality of vias are spaced from each other and from the component to achieve a desired quality factor of the component.

8. The microelectronic device of claim 1, the shield further comprising:
   a substantially continuous shield disposed in the substrate around the component, the wrap substantially surrounding the component to limit transmission of electromagnetic signals to and from the component.

9. A microelectronic device comprising:
   a substrate;
   a die coupled to the substrate;
   a first shielded assembly disposed in the substrate, the first shielded assembly including:
      a first component located at least partially within the substrate, the first component electrically connected to the die;
      a first plate disposed on a first side of the first component and spaced away from the first component;
      a second plate disposed on a second side of the first component and spaced away from the component, wherein the first component is located between the die and the first plate, or between the die and the second plate; and
      a first shield disposed around a periphery of the first component and, together with the first plate and the second plate, to limit transmission of electromagnetic signals to and from the first component;
   a second shielded assembly disposed in the substrate and spaced away from the first shielded assembly, the second shielded assembly including:
      a second component located at least partially within the substrate, the second component electrically connected to the die;
      a third plate disposed on a first side of the second component and spaced away from the second component;
      a fourth plate disposed on a second side of the second component and spaced away from the second component, wherein the second component is located between the die and the third plate, or between the die and the fourth plate; and
      a second shield disposed around a periphery of the component and, together with the first plate and the second plate, to limit transmission of electromagnetic signals to and from the component; and
   wherein one or more of the first shield or the second shield are located between the first component and the second component.

10. The microelectronic device of claim 9, the first shielded assembly further comprising:
a conductive element electrically connected to the first component and to the die.

11. The microelectronic device of claim 9, wherein:
the first shield includes a first opening with a first conductive element passing through the first opening; and
the second shield includes a second opening with a second conductive element passing through the second opening;
the first conductive element is electrically connected to the first component and to the die; and
the second conductive element is electrically connected to the second component and to the die.

12. The microelectronic device of claim 11, wherein the first opening faces a first direction and the second opening faces a second direction.

* * * * *